United States Patent [19]

Kojima et al.

[11] Patent Number: 5,089,083
[45] Date of Patent: Feb. 18, 1992

[54] PLASMA ETCHING METHOD

[75] Inventors: Hiroshi Kojima, Machida; Yoshifumi Tahara, Yamato; Izumi Arai, Yokohama, all of Japan

[73] Assignee: Tokyo Electron Limited, Tokyo, Japan

[21] Appl. No.: 512,151

[22] Filed: Apr. 20, 1990

[30] Foreign Application Priority Data

Apr. 25, 1989 [JP] Japan .................................. 1-106931

[51] Int. Cl.⁵ ............................................. H01L 21/00
[52] U.S. Cl. ..................... 156/643; 156/646; 156/657; 156/662; 156/345
[58] Field of Search ............... 156/643, 646, 657, 662, 156/345; 204/192.37, 192.35

[56] References Cited

U.S. PATENT DOCUMENTS

| | | | |
|---|---|---|---|
| 4,534,816 | 8/1985 | Chen et al. ............................ | 156/345 |
| 4,563,561 | 9/1986 | Freeman et al. ....................... | 156/646 |
| 4,565,661 | 1/1986 | Kakehi et al. ......................... | 156/643 |
| 4,931,136 | 6/1990 | Pausch et al. .................. | 156/656 X |

FOREIGN PATENT DOCUMENTS

| | | |
|---|---|---|
| 0047395 | 3/1982 | European Pat. Off. . |
| 0089382 | 9/1983 | European Pat. Off. . |
| 0353719 | 2/1990 | European Pat. Off. . |
| 8603887 | 7/1986 | World Int. Prop. O. . |

*Primary Examiner*—David A. Simmons
*Assistant Examiner*—Thi Dang
*Attorney, Agent, or Firm*—Oblon, Spivak, McClelland, Maier & Neustadt

[57] ABSTRACT

A plasma etching method including the steps of mounting an object to be processed in a region formed between one electrode and an other electrode, introducing an etching gas into the region, setting an area of the contact surface of the other electrode, which is in contact with the etching gas, to a predetermined value in accordance with a predetermined selection ratio used in etching the object, generating plasma of the etching gas by applying a predetermined electric power between the electrodes after setting the area of the contact surface of the other electrode, which is in contact with the etching gas, to the predetermined value, and etching the object by the plasma.

8 Claims, 2 Drawing Sheets

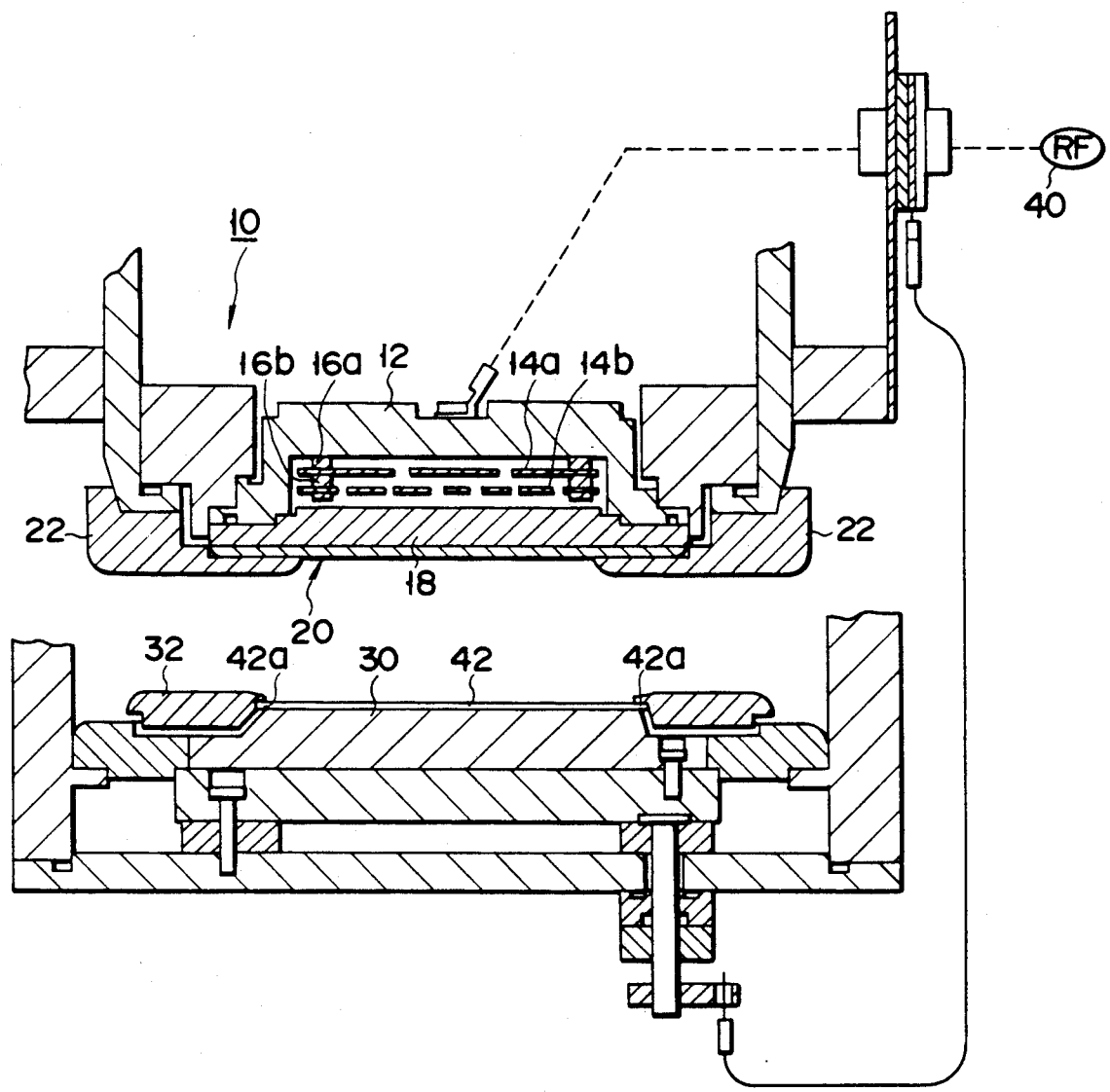
F I G. 1

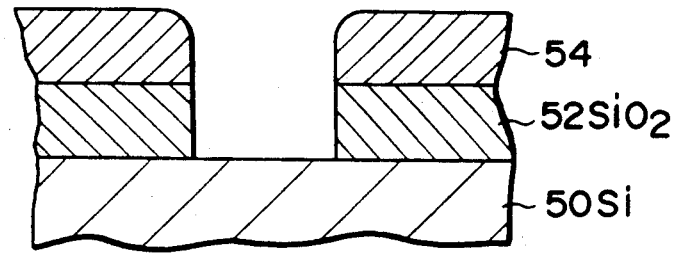
F I G. 2
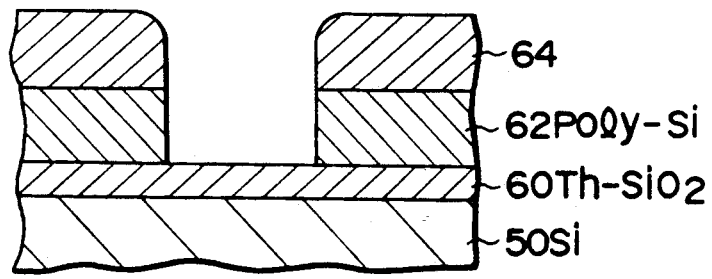
F I G. 3

PLASMA ETCHING METHOD

BACKGROUND OF THE INVENTION

1. Field of the Invention

The present invention relates to a plasma etching method.

2. Description of the Related Art

In a plasma etching apparatus, for example, a parallel plane-typed plasma etching apparatus, RF power is applied to an upper electrode, a lower electrode supporting a wafer is grounded. An etching gas is introduced between both electrodes and plasma is induced, thereby performing an etching process of the wafer.

For example, as shown in FIG. 2, in a case where an oxide film ($SiO_2$) 52, which is an etching material, formed on a Si substrate 50 is etched, the etching has been performed in such a manner that the portions except the etching portion are masked by a masking member 54 and etching gas is introduced therein.

In this case, there was necessity for a selection ratio defined below to be improved.

$$\text{Selection Ratio} = \frac{\text{Etching Grade of } SiO_2}{\text{Etching Grade of Si}}$$

In order to improve the etching grade of $SiO_2$, such improvement was conventionally made by the selection of etching gas.

As mentioned above, since the element, which determines the etching characteristics, conventionally depended on the selection of etching gas, there was a problem in that if the selection of etching gas was changed, this had a great influence on the other etching characteristics.

SUMMARY OF THE INVENTION

An object of the present invention is to provide a plasma etching method which can obtain an uniform plasma etching without depending on the selection rate.

A plasma etching method comprises the steps of mounting an object to be processed in a region formed between one electrode and the other electrode, introducing an etching gas into said region, setting an area of the contact surface of said other electrode, which is in contact with said etching gas, to a predetermined value in accordance with a predetermined selection ratio used in etching said object, generating plasma of said etching gas by applying a predetermined electric power between said electrodes after setting the area of the contact surface of said other electrode, which is in contact with said etching gas, to the predetermined value, and etching said object by said plasma.

In the plasma etching apparatus, if the etching function is roughly classified, there are a chemical reaction caused by a radical (free radical) generated in plasma and a physical function in which an ion, whose gas molecular is decomposed, collides with the etching material.

Particularly, an etching layer such as an oxide film layer having high binding energy is more strongly etched under the influence of the physical function by the ion than that of the chemical reaction by the above plasma.

According to the present invention, an opening diameter of a shield ring, which determines a degree of focus of plasma, is selected so as to obtain an uniform etching. For example, in a case where the uniformity of the etching, which is etched under the influence of the physical function by the ion, improved, an area of the contact surface of the electrode contacting the etching gas is decreased by making the opening diameter small, thereby plasma is concentrated on the processing material.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate a presently preferred embodiment of the invention, and together with the general description given above and the detailed description of the preferred embodiment given below, serve to explain the principles of the invention.

FIG. 1 is a schematic view of an embodiment of a plasma etching apparatus used in the present invention;

FIG. 2 is a schematic cross-sectional view showing a cross-section of a processing member in a case where a selection etching of $SiO_2$ is performed; and FIG. 3 is a schematic cross-section view showing a cross-section of a processing member in a case where a selection etching of a polysilicon film.

DETAILED DESCRIPTION OF THE PREFERRED EMBODIMENT

An embodiment of the present invention will be explained with reference to the drawings.

In FIG. 1, the plasma etching apparatus comprises an upper electrode 10 and a lower electrode 30, which are arranged to be opposite to each other in a reaction case. A wafer 42, which is an etching material, is mounted on the lower electrode 30. Moreover, RF power, e.g., 380 KHz is applied between the upper electrode 10 and the lower electrode 30. Then, etching gas is introduced into the reaction case through a porous portion formed on the upper electrode 10, and plasma is generated between the upper electrode 10 and the lower electrode 30, thereby performing the etching of the wafer 42.

The upper electrode 10 has a flange-formed conductive cooling member 12. A cable from RF power source 40 is connected to the cooling member 12.

Also, first and second diffusion plates 14a and 14b having a number of holes are arranged in parallel through spacers 16a and 16b. Moreover, to cover the opening of the cooling member 12, a reinforcing plate 18, and an amorphous carbon electrode 20 are laminated thereon. Additionally, there is provided a shield ring 22 in order to cover the periphery of the amorphous carbon electrode 20, thereby the opening portion contacting plasma of the amorphous carbon electrode 20 is formed.

The lower electrode 30 can mount a wafer 42, which is an etching material, in its upper surface of the projected disc-shaped portion. In order to connect periphery 42a of the wafer 42 to the lower electrode 30 and secure thereto, a ring-shaped clamper 32 is arranged around the lower electrode 30. Additionally, the lower electrode 30 is grounded.

As mentioned above, the upper electrode 10 and the lower electrode 30 are arranged to be spaced from each other in the chamber, thereby constituting the parallel plane-typed etching apparatus.

As a characteristic structure of this embodiment, the opening diameter of the shield ring 22 is determined so as to obtain an uniform etching of the etching portion. For example, in a case where the etching grade of an etching layer such as $SiO_2$ having high binding energy is improved, the shield ring 22 having the small opening diameter is employed.

An operation of this apparatus will be explained as follows.

In the above apparatus, RF power from the RF power source 40 is applied between the upper electrode 10 and the lower electrode 30 and etching gas is introduced into the upper portion of the lower electrode 30 via the upper electrode 10. Thereby, plasma is induced between the upper and lower electrodes 10 and 30, and a radical generated in plasma is adhered to the surface of wafer 42, so that a chemical reaction is generated. Moreover, an ion decomposed in plasma is accelerated by an electric field formed between the parallel plate-shaped electrodes. Thereby, the ion collides with the wafer 42 and the etching of the wafer 42, which is the etching material, is performed. By the use of this type of parallel plate-shaped etching apparatus, an anisotropic etching, in which a side etching is reduced, can be performed and a fine pattern etching can be realized.

Therefore, the etching by the physical function, in which the ion is accelerated and collides with the surface of the wafer 42, more largely contributes to the etching of oxide film 52 shown in FIG. 2 than the chemical reaction by the radical.

In this embodiment, by strengthening the etching based on the physical function of the ion, the etching grade of the oxide film 52 is increased and the selection ratio (VsSi) is improved.

In other words, the shield ring 22 is formed of an insulating member such as quartz, ceramic, etc. For this reason, if the opening diameter of the shielding ring 22 is narrowed, an area contributing to plasma of the amorphous carbon electrode 20 is narrowed down to the central side. Therefore, plasma is focused on the central position opposite to the wafer 42.

As a result, if the ion generated in plasma is accelerated between these electrodes, the ratio in which the ion concentrates on $SiO_2$ layer 52 of the wafer 42, is raised, thereby the etching grade of the $SiO_2$ can be improved.

On the other hand, in a case where the etching grade is lowered, the opening diameter of the shielding ring 22 may be widened.

For example, in a case where the polysilicon film 62 of an etching material having a thermal oxide film (Th-$SiO_2$)60 and polysilicon film 62 (Poly-Si) formed on a Si substrate 50 is masked by a masking member 64 and etched as shown in FIG. 3, thereby the uniform etching of the polysilicon film is obtained. In this case the selection ratio of the etching is defined below.

$$\text{Selection Ratio} = \frac{\text{Etching Grade of Polysilicon}}{\text{Etching Grade of Ground Th—SiO}_2}$$

In this case, in order to control the etching grade of the thermal oxide film 60 having relatively high binding energy, the degree of the concentration of plasma on the wafer 42 may be reduced by widening the opening diameter of the shield ring 22.

In the present invention, not only the polysilicon film but also the other film like the polysilicon film is used for an etching material.

As mentioned above, according to the present invention, the opening of the diameter of the shield ring is selected, thereby changing the area of the contact surface of the electrode contacting the etching gas, so that density of plasma is controlled. Therefore, a uniform etching is obtained.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A plasma etching method, comprising the steps of:
mounting an object to be processed, having at least a material to be etched and a primary material, in a region formed between one electrode and an other electrode;
introducing an etching gas into said region;
setting an area of the contact surface of said other electrode, which is in contact with said etching gas, to a predetermined value in accordance with a predetermined selection ratio used in etching said object to be processed, wherein said selection ratio denotes a ratio of the etching rate of said material to be etched to the etching rate of said primary material beneath said material to be etched; generating plasma of said etching gas by applying a predetermined electric power between said electrodes after setting the area of the contact surface of said other electrode, which is in contact with said etching gas, to the predetermined value; and
etching said object to be processed by said plasma; wherein the material to be etched is a $SiO_2$ layer and the primary material is a Si layer.

2. The plasma etching method according to claim 1, wherein the predetermined area of the contact surface of said other electrode, which is in contact with said etching gas, is covered with an insulating member, thereby setting the area of said contact surface to the predetermined value.

3. The plasma etching method according to claim 2, wherein said insulating member is an insulating shield ring having a diameter selected in dependence on the material to be etched.

4. The plasma etching method according to claim 1, wherein a physical function, in which an ion whose gas molecular is decomposed in plasma, collides with the etching material, is used for etching said object to be processed.

5. A plasma etching method, comprising the steps of:
mounting an object to be processed, having at least a material to be etched and a primary material, in a region formed between one electrode and an other electrode;
introducing an etching gas into said region;
setting an area of the contact surface of said other electrode, which is in contact with said etching gas, to a predetermined value in accordance with a predetermined selection ratio used in etching said object to be processed, wherein said selection ratio denotes a ratio of the etching rate of said material to be etched to the etching rate of said primary material beneath said material to be etched;

generating plasma of said etching gas by applying a predetermined electric power between said electrodes after setting the area of the contact surface of said other electrode, which is in contact with said etching gas, to the predetermined value; and etching said object to be processed by said plasma; wherein the material to be etched is a silicon layer and the primary material is a $SiO_2$ layer.

6. The plasma etching method according to claim 5, wherein the predetermined area of the contact surface of said other electrode, which is in contact with said etching gas, is covered with an insulating member, thereby setting the area of said contact surface to the predetermined value.

7. The plasma etching method according to claim 6, wherein said insulating member is an insulating shield ring having a diameter selected in dependence on the material to be etched.

8. The plasma etching method according to claim 5, wherein a physical function, in which an ion whose gas molecular is decomposed in plasma, collides with the etching material, is used for etching said object to be processed.

* * * * *